(12) United States Patent
Joo

(10) Patent No.: US 6,566,910 B1
(45) Date of Patent: May 20, 2003

(54) LOW POWER DUAL TRIP POINT INPUT BUFFER CIRCUIT

(75) Inventor: Byungha Joo, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/034,080

(22) Filed: Dec. 19, 2001

(51) Int. Cl.[7] .............................................. H03K 3/037
(52) U.S. Cl. ........................... 326/83; 326/57; 327/206
(58) Field of Search .......................... 327/206; 326/83, 326/86, 56–58

(56) References Cited

U.S. PATENT DOCUMENTS 4,539,489 A * 9/1985 Vaughn ...................... 327/206

6,388,488 B1 * 5/2002 Ho .............................. 327/112
6,433,602 B1 * 8/2002 Lall et al. .................... 327/205

* cited by examiner

Primary Examiner—Don Le
(74) Attorney, Agent, or Firm—Kenyon & Kenyon

(57) ABSTRACT

A method and system for reducing the power consumption in a class of circuits utilizing inverters which rely upon a resistive load design such as pseudo NMOS and/or pseudo PMOS. In particular, rather than utilizing the load network to provide a resistive load, which imposes static dissipation, the load network is driven by the input signal along with the logic network. The circuit is then configured to function in a CMOS configuration by driving both the load and logic networks with the input signal.

21 Claims, 19 Drawing Sheets

LOW POWER DUAL TRIP POINT INPUT BUFFER CIRCUIT

FIELD OF THE INVENTION

The present invention relates to the reduction of power consumption in digital circuits that rely upon a resistive load design such as pseudo NMOS and/or pseudo PMOS.

BACKGROUND INFORMATION

Reducing power consumption in digital circuits has become increasingly important, especially for real time clocking (RTC) applications which are operated by a low capacity battery (typically 200 mA-hr). For these applications, having low power consuming circuit elements may be essential to prolong battery lifetime.

Power consumption determines how much heat the circuit dissipates and how much energy is consumed. It can be decomposed into two components: static and dynamic. The dynamic component only occurs during transients, i.e. when the circuit is switching. It is due to the charging of capacitive elements and temporary current paths between the supply rails, and is, therefore, proportional to the switching frequency and duration: the greater the number of switching events and the longer they occur, the greater the dynamic power consumption. The static component on the other hand is present even when no switching occurs and is caused by static conductive paths between the supply rails or by leakage currents.

A bistable pulse generator, known as the Schmidt Trigger, is frequently used in RTC applications to "clean up" noisy signals by switching at a different threshold on rising and falling edges of an input signal. FIG. 1a is a transistor level diagram of a conventional Schmidt Trigger circuit. This type of circuit may consume a large current during switching transitions, i.e. a high dynamic power consumption. As FIG. 1b illustrates, intermediate transistors MP3 and MN3 provide a direct current path from the power source to ground during the transition phase. As a result, the dynamic power consumption of the Schmidt Trigger may be quite significant.

FIG. 2a shows the voltage characteristic of Schmidt Trigger circuit 1000 during a high to low transition. FIG. 2b demonstrates the current consumption of Schmidt Trigger circuit 1000 during this same period.

FIG. 2a shows input voltage v(in) decreasing linearly while output voltage v(out) remains constant at a high potential (~1.5 v) until input voltage v(in) reaches a particular threshold level (~0.3 v) whereupon output voltage v(out) drops suddenly and sharply (~0.0 v). Corresponding to the transition from a high to low voltage level, a significant current i(mp3) flows via intermediate transistor MP3 as indicated in FIG. 2b.

FIG. 3a shows the voltage characteristic of Schmidt Trigger circuit 1000 during a low to high transition. FIG. 3b demonstrates the current consumption of Schmidt Trigger circuit 1000 during this same period FIG. 3a shows input voltage v(in) increasing linearly while output voltage v(out) remains constant at a low potential (~0.0 v) until input voltage v(in) reaches a particular threshold level (~1.1 v) whereupon output voltage v(out) rises suddenly and sharply (~1.5 v). Corresponding to the transition from a low to high voltage level, a significant current i(mn3) flows via intermediate transistor MN3 as indicated in FIG. 3b.

FIG. 4a shows a block diagram of a Current Mode Dual Trip Point design (a.k.a the Intel 82801BA circuit or I/O Controller Hub2 or South Bridge) for reducing dynamic power dissipation in a bistable pulse generator circuit. Current Mode circuit 4000 includes bias circuit 4900, low trip point inverter 4100, high trip point inverter 4200, tri-state inverter 4300, weak intermediate inverter 4400, and 2-stage output buffer 4500. Low trip inverter 4100 includes load network 4101 coupled to bias circuit 4900 and logic network 4102 coupled to input IN. High trip point inverter 4200 includes load network 4201 coupled to the bias circuit 4900 and logic network 4202 coupled to input IN.

FIG. 4b shows a transistor level diagram of the Current Mode Dual Trip Point design. In particular, the circuit shown in FIG. 4b uses pseudo N-MOS arranged circuitry (transistors MPP1, MPP2, MNP1, MNP2) to control the current during a low phase operation and pseudo P-MOS arranged circuitry (transistors MPN1, MNN1, MNN2) to control the current during a high phase operation. In particular, transistor MPP1 serves as a load network and transistors MPP2, MNP1, MNP2 serve as a logic network. Transistor MPN1 serves as a load network and transistors MNN1, MNN2 serve as a logic network.

The pseudo N-MOS arranged circuitry acts as a low trip point buffer 4100 changing its output voltage level at particular low input voltage level while the pseudo P-MOS arranged circuitry acts as a high trip point buffer 4200 changing its output voltage level at a particular low input voltage level. Dynamic power dissipation is reduced because load network resistance may be controlled. However, with this design there is unwanted static power dissipation due to the presence of bias circuit 4900 which consumes static current, as well as pseudo NMOS/PMOS arranged circuitry of high trip point inverter 4200 and pseudo PMOS arranged circuitry of low trip point inverter 4100.

FIG. 5a shows the voltage characteristic of Current Mode circuit 4000 during a high to low transition. FIG. 5b demonstrates the current consumption of Current Mode circuit 4000 during this same period.

FIG. 5a shows input voltage v(in) decreasing linearly while output voltage v(out) remains constant at a high potential (~1.5 v) until input voltage v(in) reaches a particular threshold level (~0.4 v) whereupon output voltage v(out) drops suddenly and sharply (~0.0 v).

FIG. 5b demonstrates that overall current consumption i(vss) during the high to low transition is reduced as compared with Schmidt Trigger circuit 1000. However, this overall current consumption i(vss) exists regardless of whether circuit 4000 is in the high to low transition state or merely in the steady state. Such steady state current is consumed by bias circuitry 4900 represented by currents i(mnb1) and i(mnb2), pseudo NMOS circuitry 4100 represented by current i(mnn2), and pseudo PMOS circuitry 4200 represented by current i(mnp2).

FIG. 6a shows input voltage v(in) increasing linearly while output voltage v(out) remains constant at a low potential (~0.0 v) until the input voltage v(in) reaches a particular threshold level (~0.9 v) whereupon output voltage v(out) rises suddenly and sharply (~1.5 v). FIG. 6b demonstrates that overall current consumption i(vss) during the low to high transition is reduced as compared with Schmidt Trigger circuit 1000. However, this overall current consumption i(vss) exists regardless of whether circuit 4000 is in the low to high transition state or merely in the steady state. Such steady state current is consumed by bias circuitry

4900 by currents i(mnb1) and i(mnb2), pseudo NMOS circuitry 4100 represented by current i(mnn2), and pseudo PMOS circuitry 4200 represented by current i(mnp2).

BRIEF DESCRIPTION OF THE DRAWINGS

FIG. 1b shows the flow of current during high to low and low-to-high transitions in the Schmidt Trigger circuit of FIG. 1a.

DETAILED DESCRIPTION

The circuit design according to the present invention provides a method and system for reducing power consumption in a class of circuits which rely upon a resistive load design such as pseudo NMOS and/or pseudo PMOS. In particular, rather than utilizing the load network to provide a resistive load, which imposes static power dissipation, the load network is driven by the input signal along with the logic network. Thus, for example, in a pseudo NMOS or pseudo PMOS design, the circuit is reconfigured to function in a CMOS configuration by driving both the load and logic networks with the input signal. Furthermore, the input signal may be directly coupled to the load network.

According to one embodiment, the circuit design of the present invention applies to an input buffer circuit for processing an input signal. A current mode design of the input buffer utilizing pseudo NMOS and pseudo PMOS logic is reconfigured to function in a CMOS configuration by driving both the resistive network and the logic network with the input signals. For example, the circuit design of the present invention may virtually eliminate static power consumption as compared with the Current Mode Dual Trip circuit design. Since CMOS circuits are utilized, the quiescent currents are extremely small—an obvious advantage for the practicality of digital watches, for example, and one which may also alleviate heat dissipation problems in high-density chips. Additionally, the circuit design of the present invention introduces topological changes in connectivity resulting in enhanced performance and reduced propagation delay. Furthermore, the circuit design of the present invention may require fewer circuit components resulting in an overall cost reduction benefit as well.

Figure 1A:
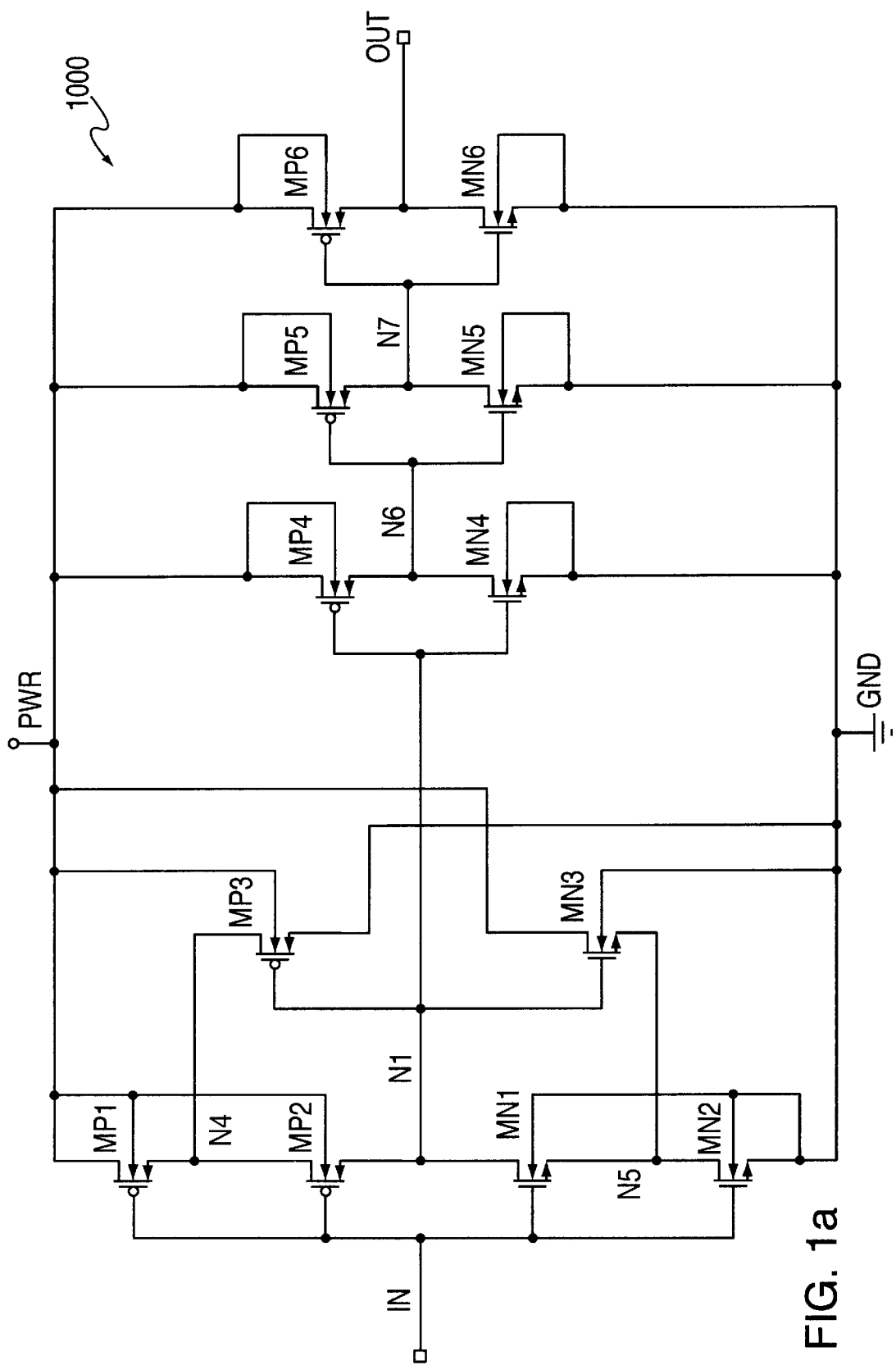
FIG. 1a shows a conventional Schmidt Trigger circuit design.
Figure 1B:
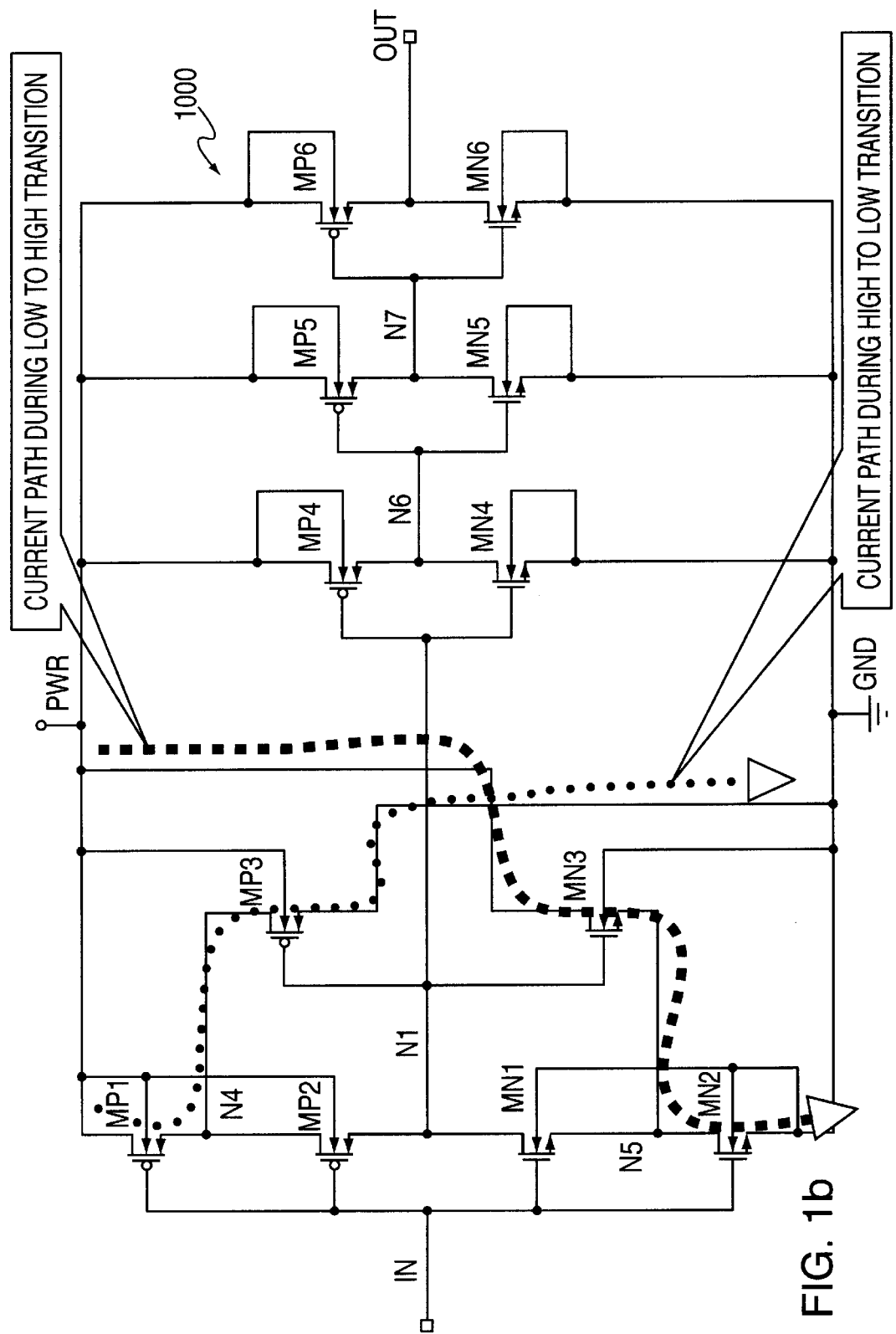
Figure 2A:
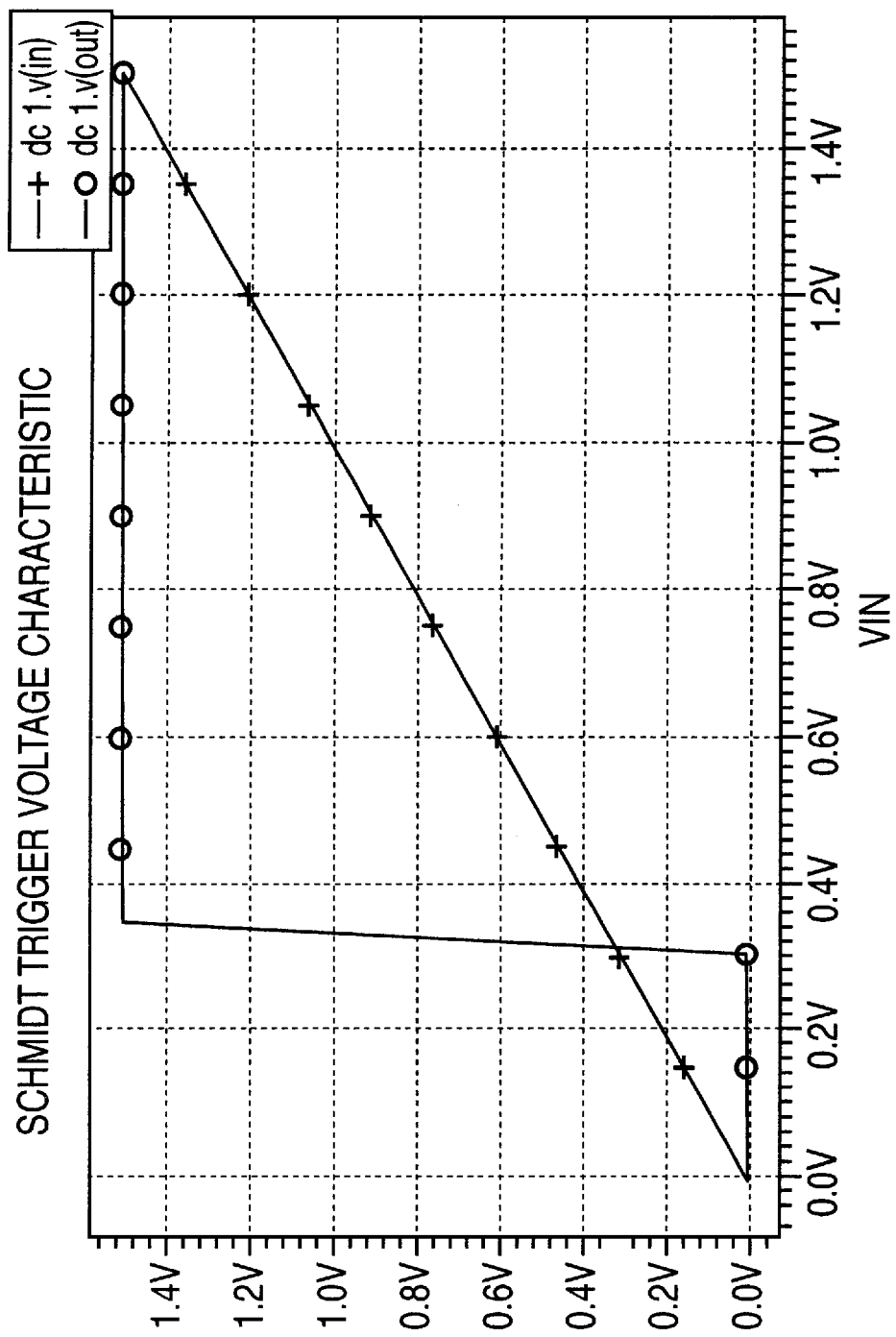
FIG. 2a shows the voltage characteristic of the Schmidt Trigger circuit during a high to low transition.
Figure 2B:
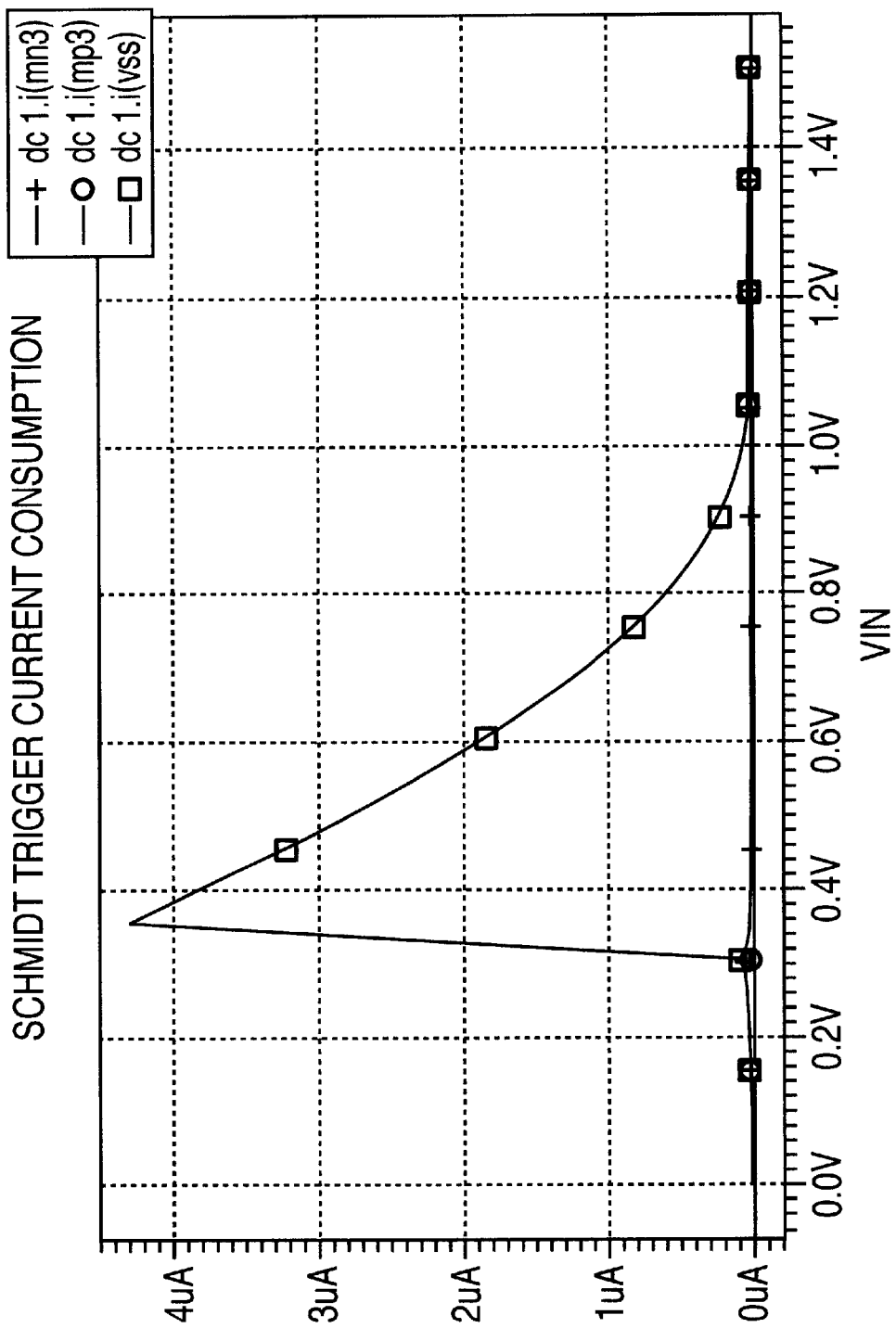
FIG. 2b shows the current consumption of the Schmidt Trigger circuit during the high to low transition.
Figure 3A:
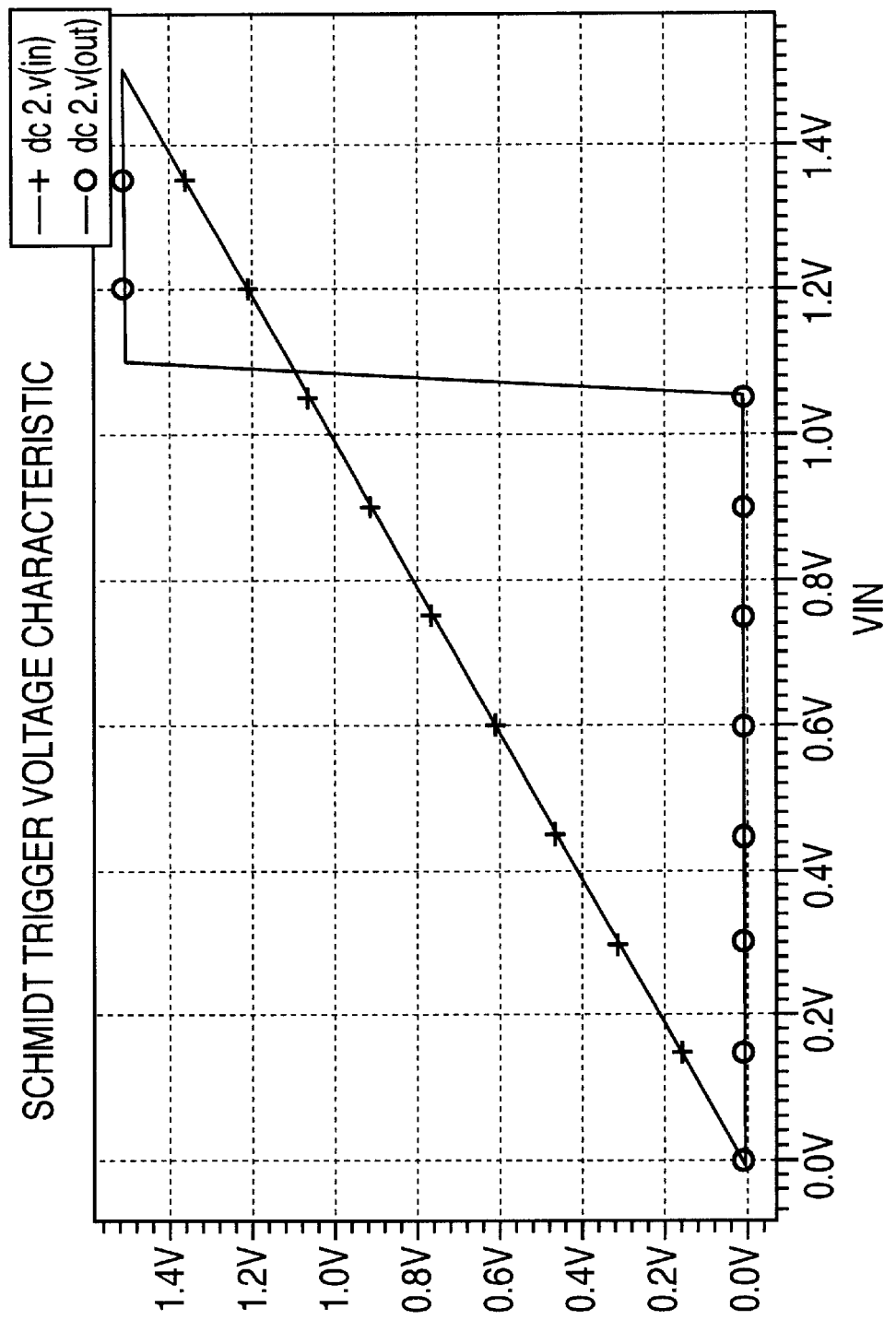
FIG. 3a shows the voltage characteristic of the Schmidt Trigger circuit during a low to high transition.
Figure 3B:
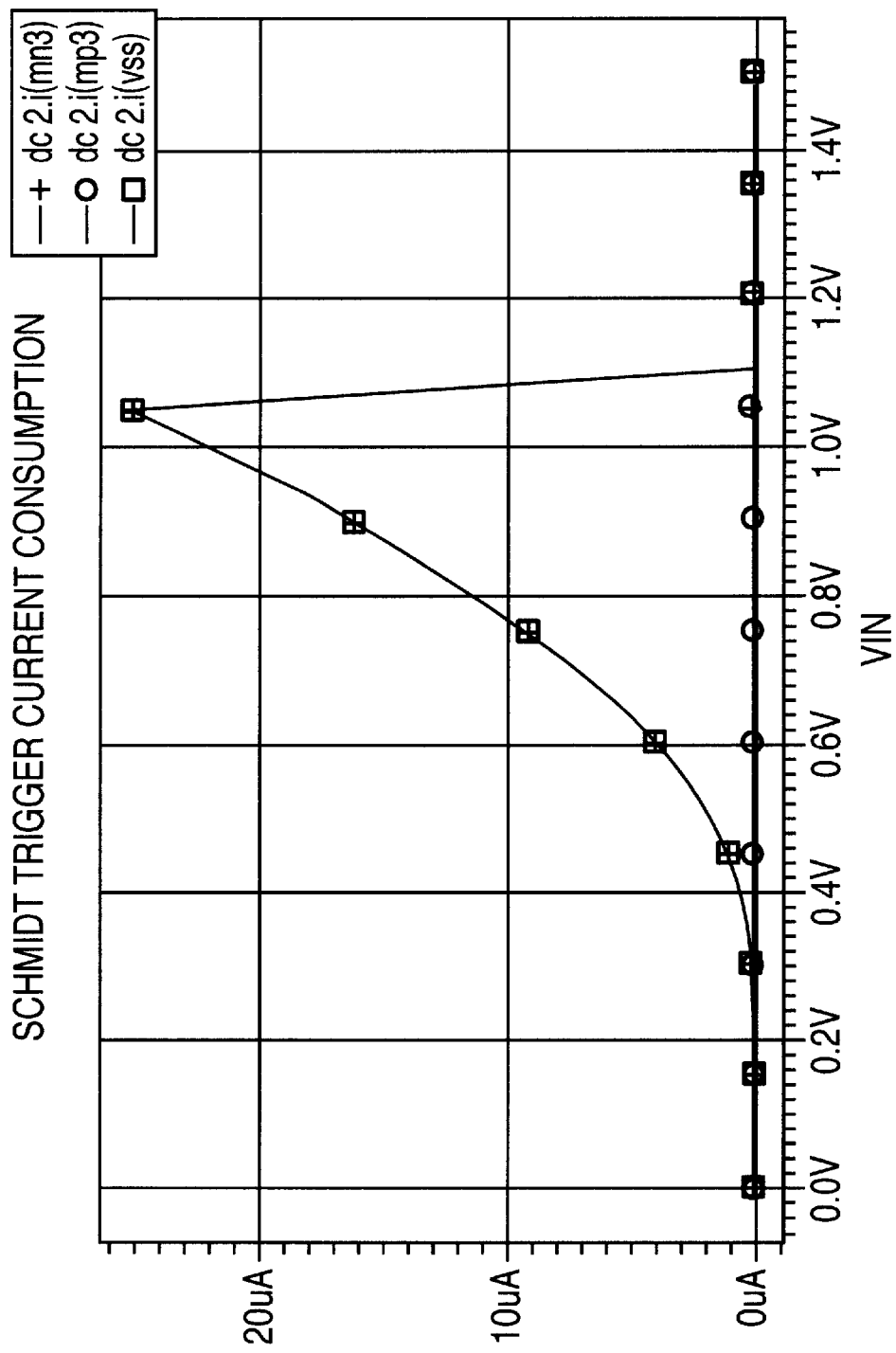
FIG. 3b shows the current consumption of the Schmidt Trigger circuit during the low to high transition.
Figure 4A:
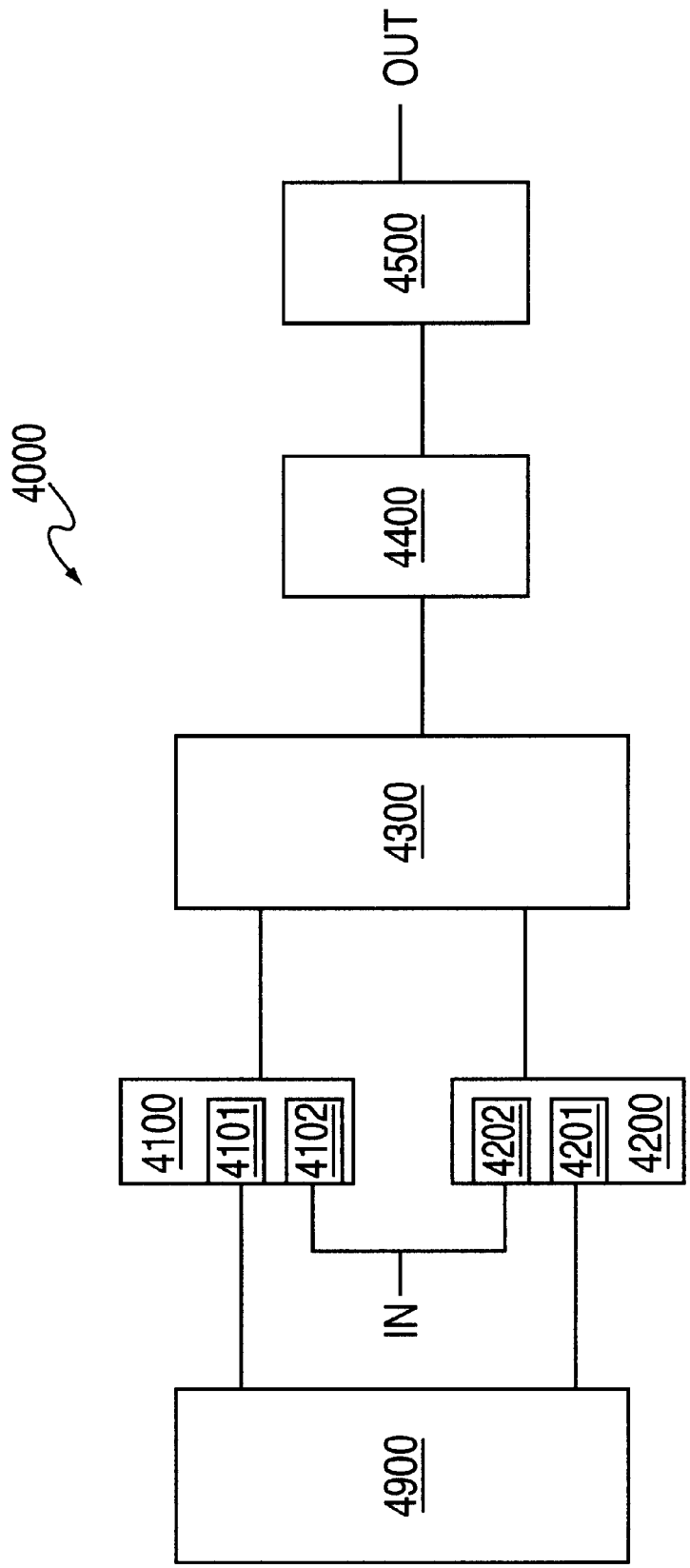
FIG. 4a shows a high level abstraction of the circuit design of the Current Mode Dual Trip Point circuit utilizing pseudo P-MOS and N-MOS arranged circuitry.
Figure 4B:
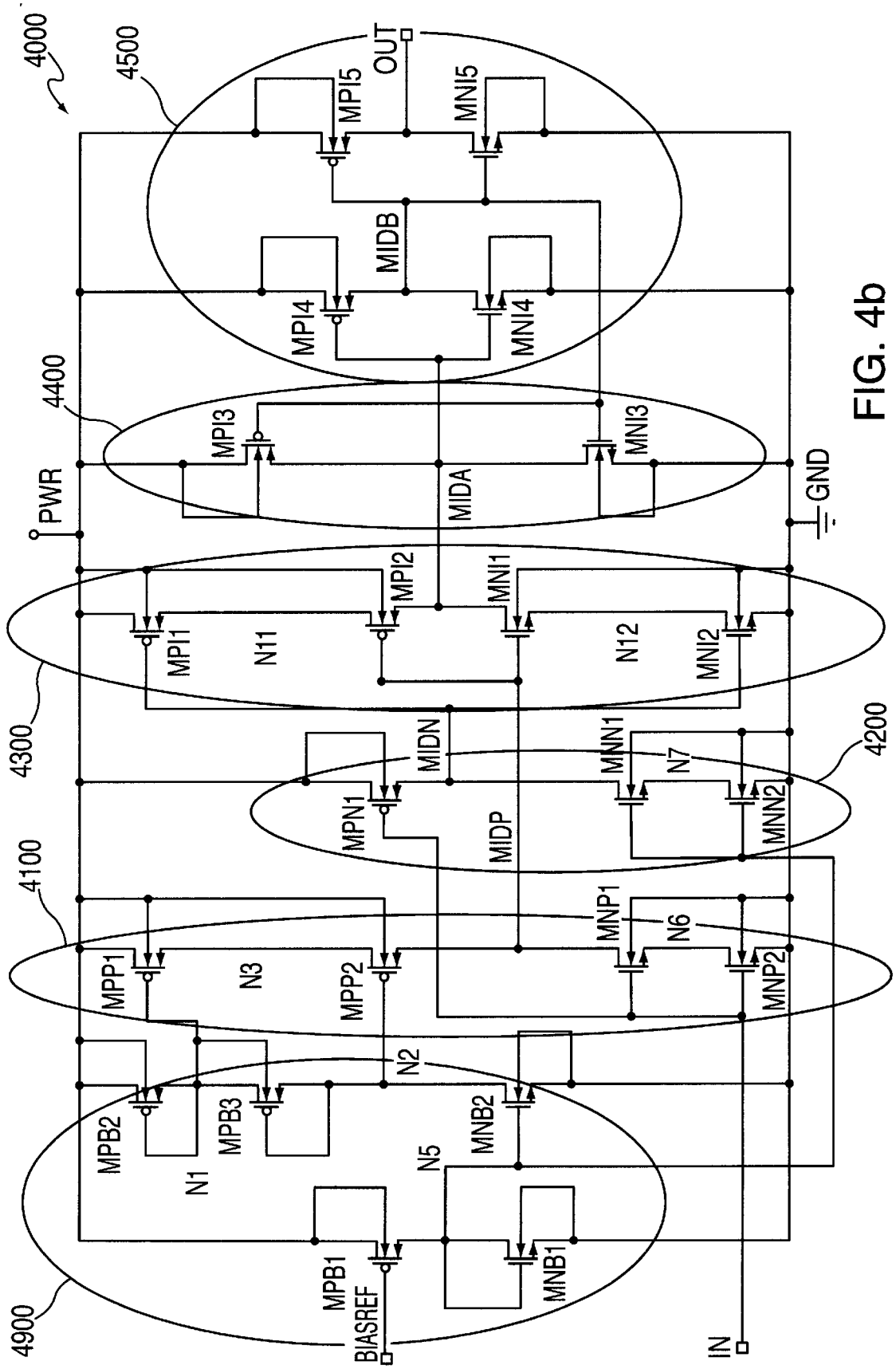
FIG. 4b shows, in greater detail, the circuit design of the Current Mode Dual Trip Point circuit utilizing the pseudo P-MOS and pseudo N-MOS arranged circuitry.
Figure 5A:
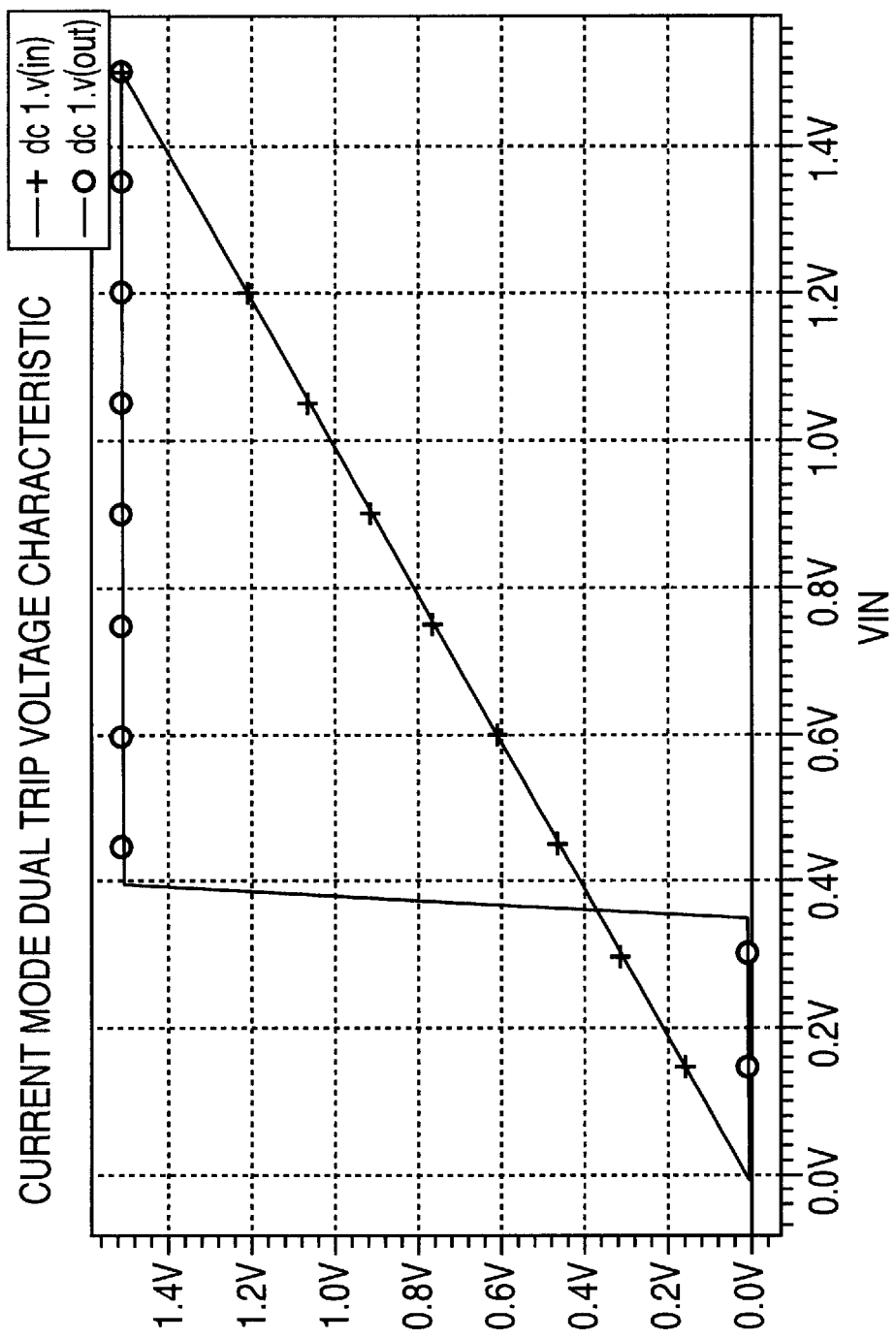
FIG. 5a shows the voltage characteristic of the Current Mode Dual Trip Point circuit during a high to low transition.
Figure 5B:
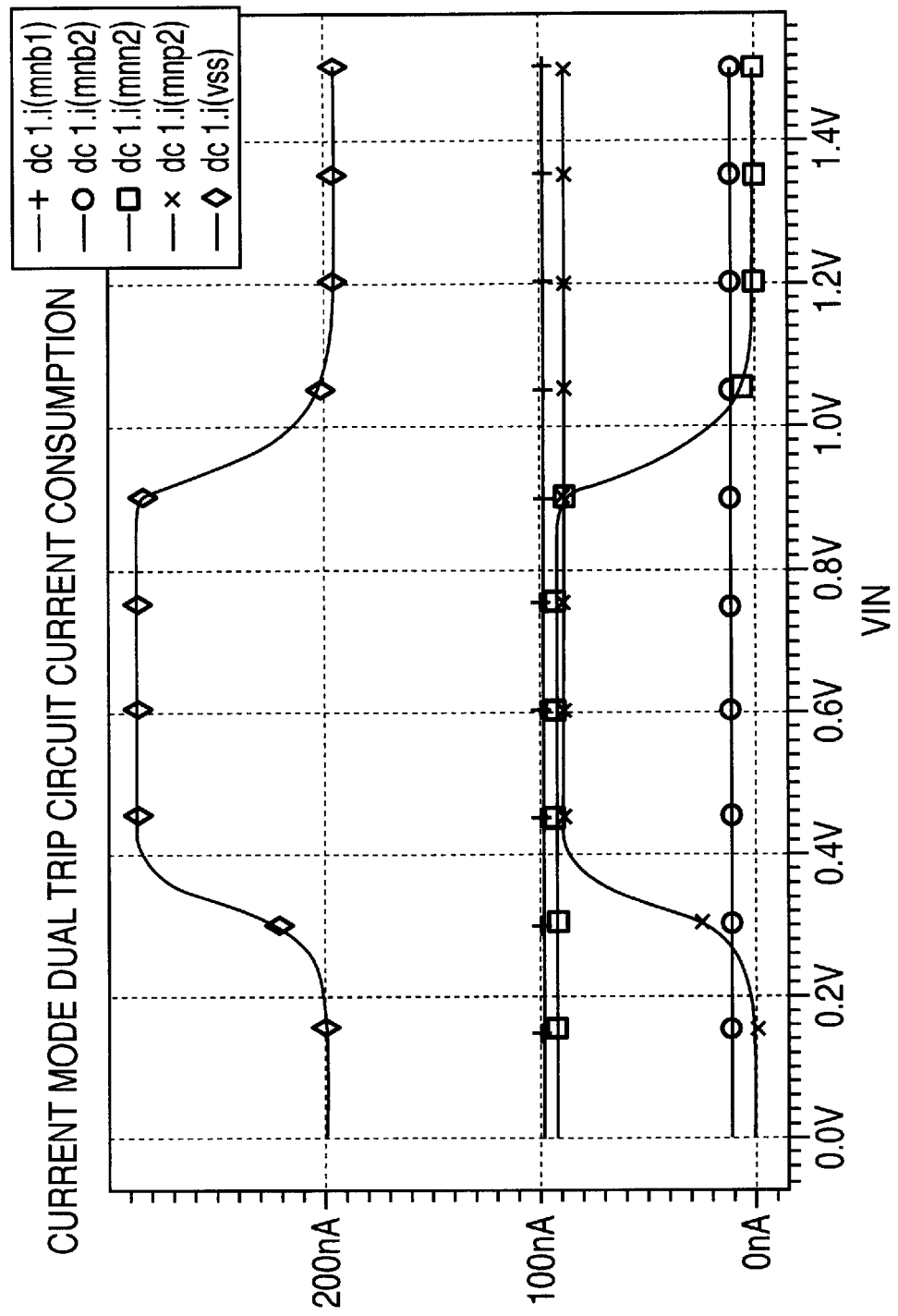
FIG. 5b shows the current consumption of the Current Mode Dual Trip Point circuit during high to low transition.
Figure 6A:
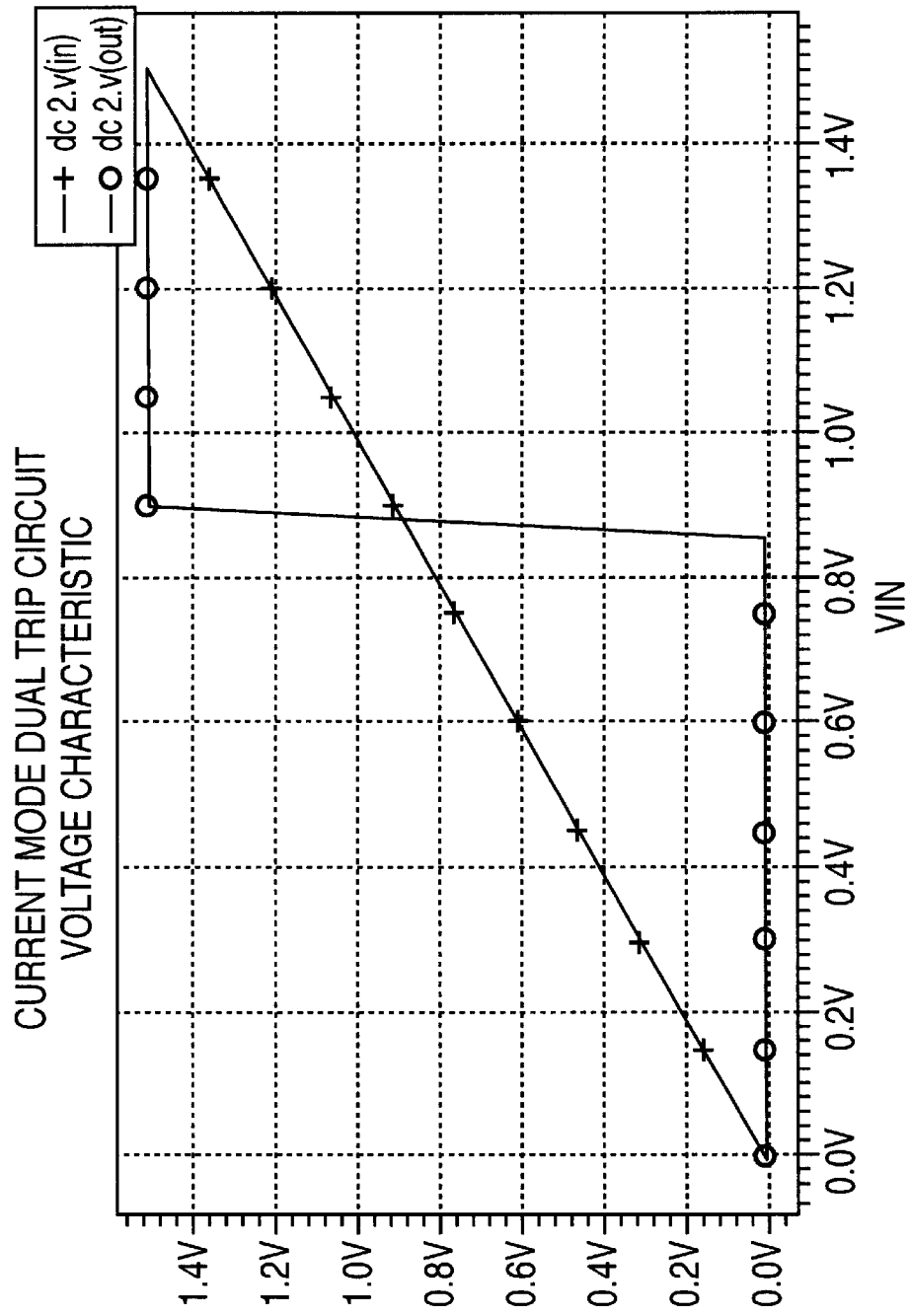
FIG. 6a shows the voltage characteristic of the Current Mode Dual Trip Point circuit during a low to high transition.
Figure 6B:
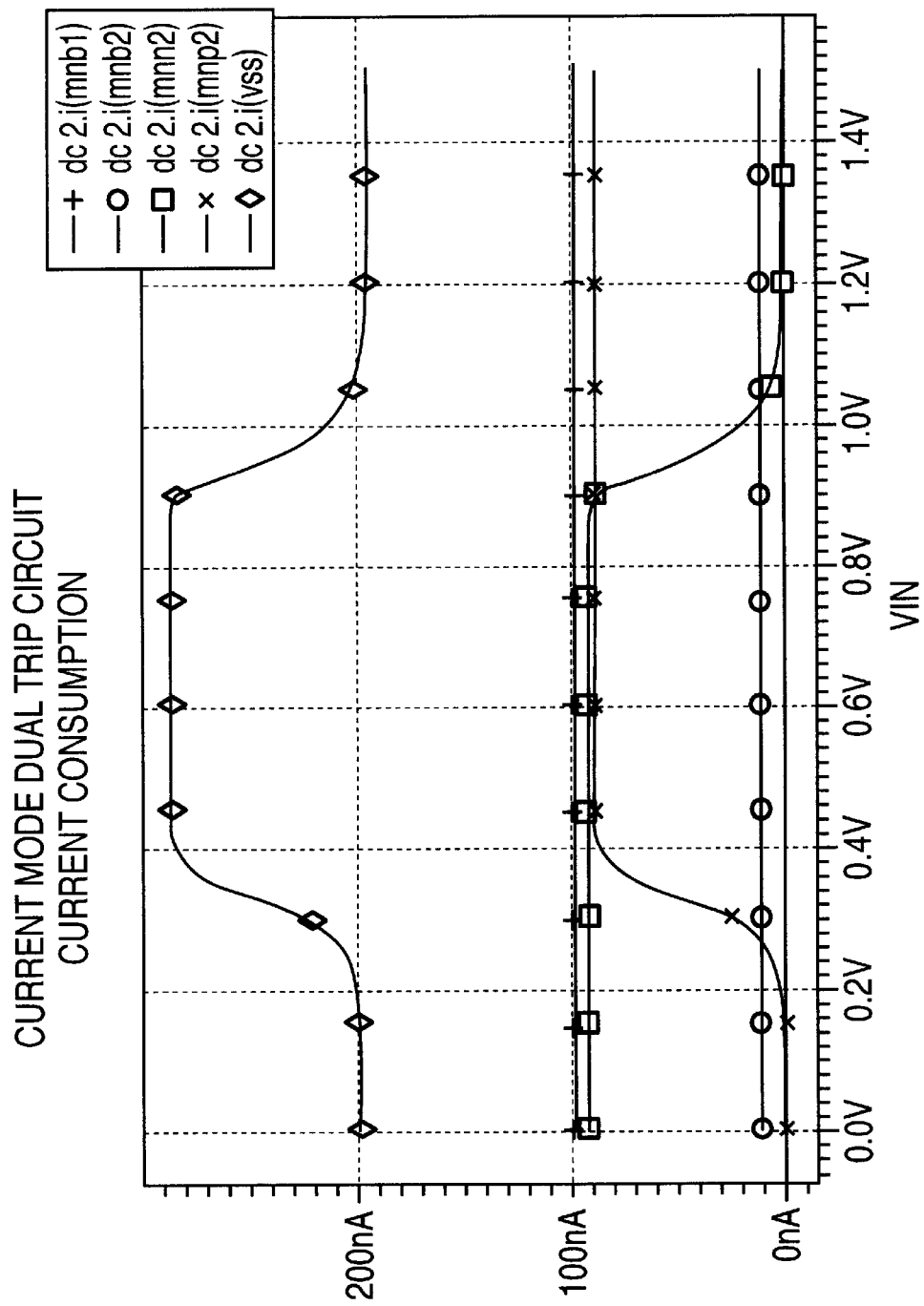
FIG. 6b shows the current consumption of the Current Mode Dual Trip Point circuit during low to high transition.
Figure 7A:
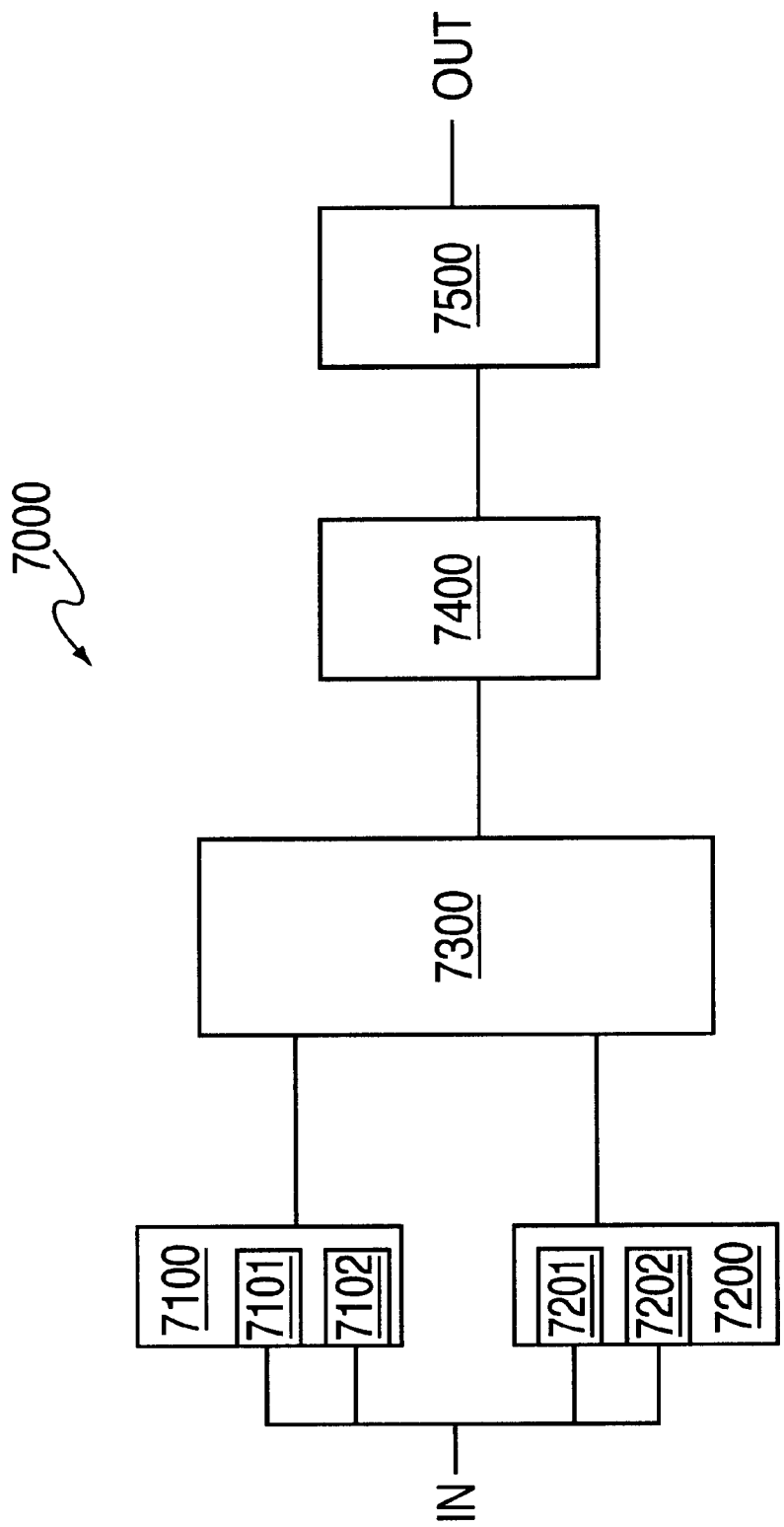
FIG. 7a shows an exemplary embodiment of the present invention, the Low Power Dual Trip Point circuit.

An exemplary embodiment of the present invention is shown in FIG. 7a. A low power dual trip point circuit 7000 includes low trip point inverter 7100, high trip point inverter 7200, tri-state inverter 7300, weak intermediate inverter 7400, and 2-stage buffer 7500. Low trip point inverter 7100 having complementary logic networks 7101, 7202 performs an inversion of input signal IN at a predefined low threshold, i.e. a low trip point. High trip point inverter 7200 having complementary logic networks 7201, 7202 performs an inversion of input signal IN at a predefined high threshold, i.e. a high trip point. Tri-state inverter performs an inversion of the outputs of low and high trip point inverters 7100, 7200 only if they have the same logic value. Otherwise, a high impedance state will exist in tri-state inverter 7300. Weak intermediate inverter 7400 retains a previous value when not driven by the output of tri-state inverter 7300. 2-stage output buffer provides a sharp output transition appearing on output OUT.

A comparison of Current Mode circuit 4000 with low power dual trip point circuit 7000 of the present invention shows that the bias circuitry 4900 may be eliminated. Furthermore, according on exemplary embodiment of the present invention, the pseudo NMOS and PMOS arranged circuitry utilized for the low and high trip inverters 4100, 4200 may be reconfigured with static CMOS arranged circuitry 7100, 7200. In particular, load and logic networks 4101, 4102, 4201, 4202 have been reconfigured as complementary logic networks 7101, 7102 and 7201, 7202. Unlike pseudo PMOS and NMOS arranged circuitry, the static power dissipation of CMOS circuitry is primarily limited to leakage. Hence, with no bias circuit and with CMOS implemented technology, the static power consumption may be dramatically reduced.

Figure 7B:
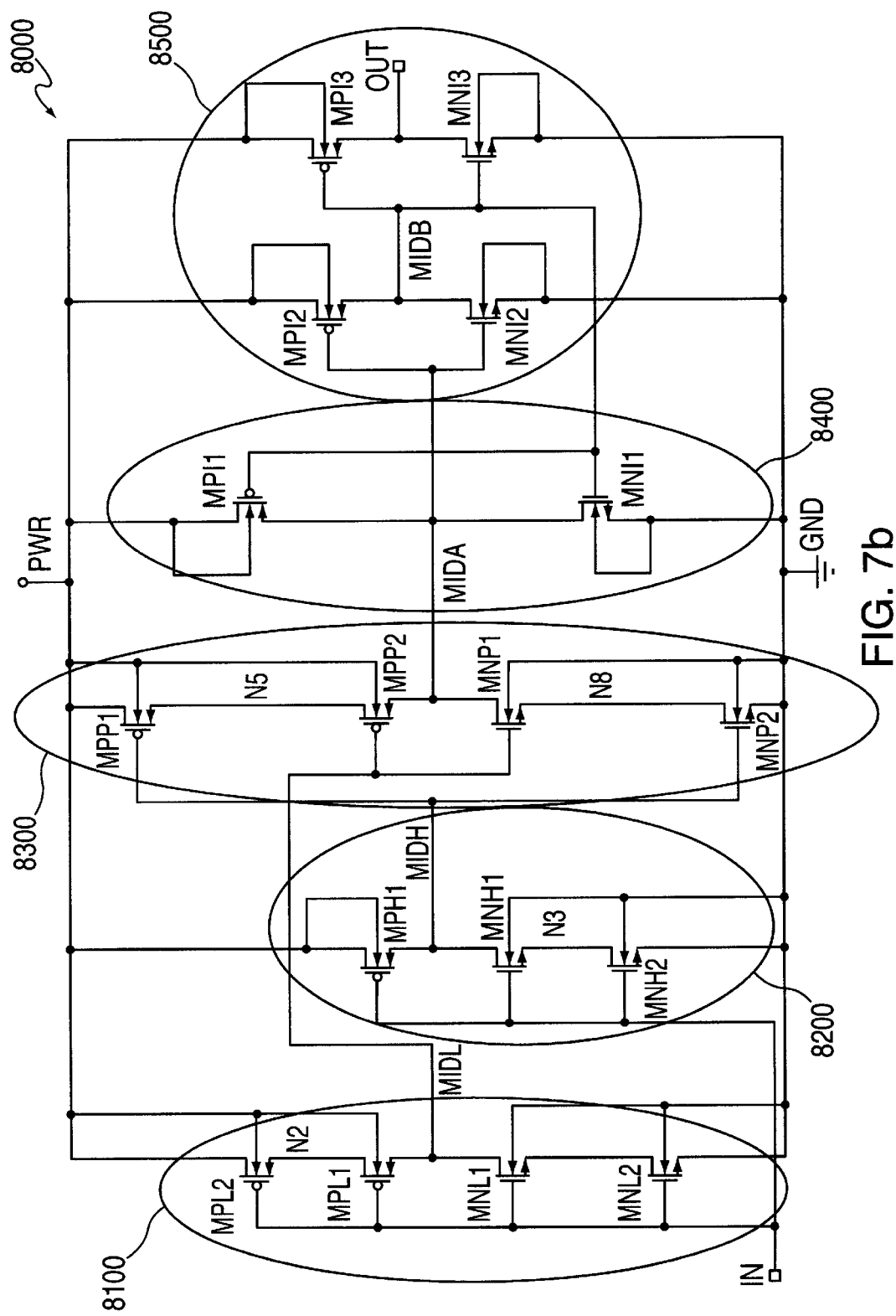
FIG. 7b shows, in greater detail, an alternative exemplary embodiment of the present invention.

FIG. 7b describes an alternative embodiment of the present invention. As shown in FIG. 7b, low power dual trip point circuit 8000 includes low trip point inverter 8100, high trip point inverter 8200, tri-state inverter 8300, weak intermediate inverter 8400, and two-stage output buffer 8500. More specifically, PMOS transistors MPL1, MPL2, and NMOS transistors MNL1, MNL2 form low trip point inverter 8100 which performs an inversion of input signal IN at a predefined low threshold, i.e. a low trip point. NMOS transistors MNH1, MNH2, and PMOS transistor MPH1 form high trip point inverter 8200 which performs an inversion of input signal IN at a predefined high threshold, i.e. a high trip point. PMOS transistors MPP1, MPP2, and NMOS transistors MNP1, MNP2, form tri-state inverter 8300 which changes its state only if both nodes MIDL and MIDH have the same logic value. Node MIDL represents the output of low trip point inverter 8100 and node MIDH represents the output of high trip point inverter 8200.

Additionally, PMOS transistor MPI1 and NMOS transistor MNI1 form weak intermediate inverter 8400 which retains a previous value when not driven by output of tri-state inverter 8300 represented by node MIDA. PMOS transistors MPI2, MPI3, and MNI2, MNI3 form 2-stage buffer 8500 for sharp output transition appearing on output OUT.

Figure 7C:
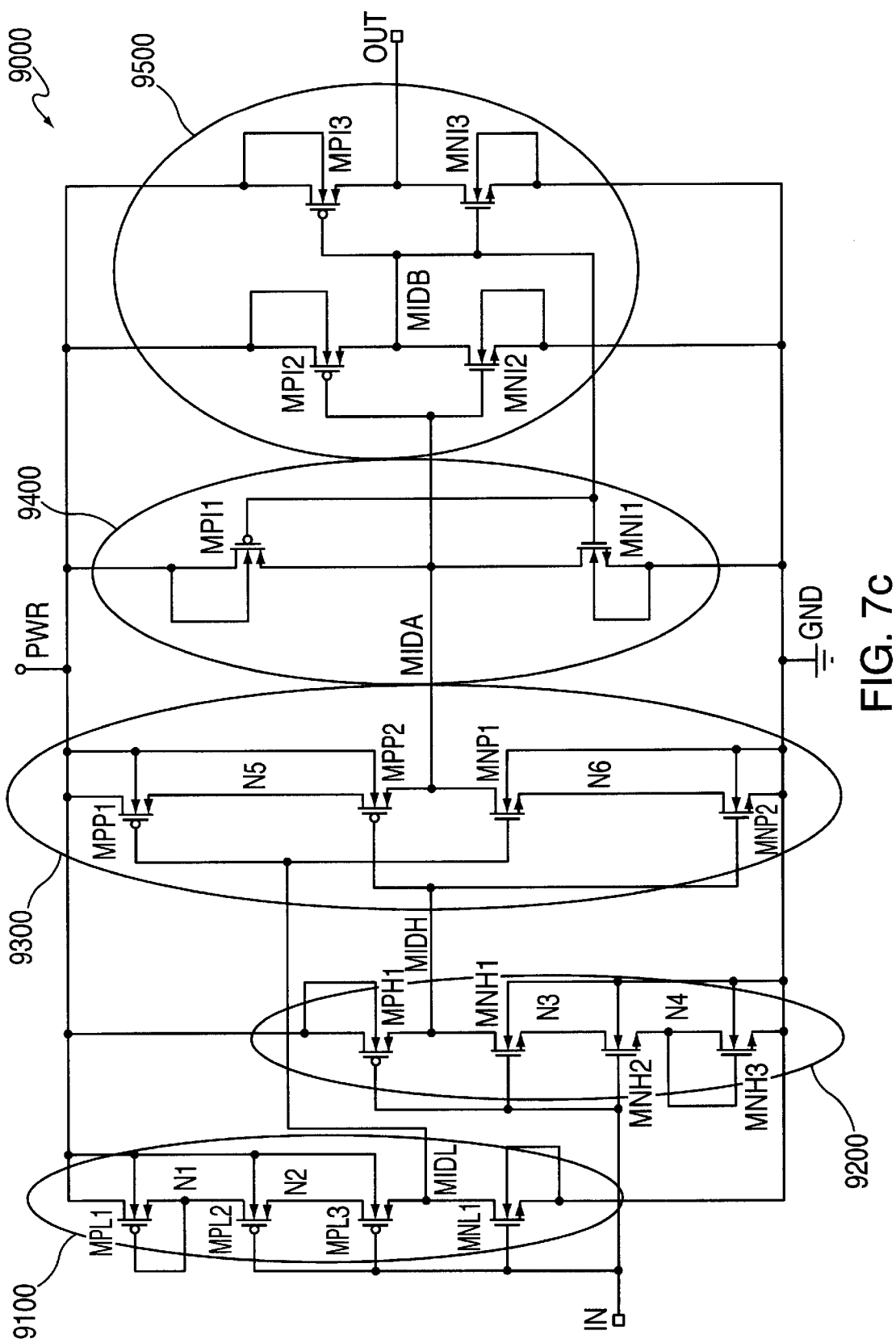
FIG. 7c shows another detailed alternative exemplary embodiment of the present invention.

The alternative exemplary embodiment of FIG. 7b may be improved to provide enhanced performance with a further reduction in power consumption. FIG. 7c shows another alternative exemplary embodiment according to the present invention demonstrating these further improvements. As shown in FIG. 7c, PMOS transistors MPL1, MPL2, MPL3 and NMOS transistor MNL1 form low trip point inverter 9100 which performs an inversion of input signal IN at a predefined low threshold, i.e. a low trip point. With transistors MPL2 and MPL3 forming weak transistor and with the gate of transistor MPL1 tied to its source thereby acting as a resistor in the path to power source PWR, the threshold of inverter 9100 is skewed low. Fine tuning of low threshold is possible by adjusting the transistor size of transistors MPL2, MPL3, and MNL1 and/or adding cascading additional transistors.

Similarly, NMOS transistors MNH1, MNH2, MNH3 and PMOS transistor MPH1 form high trip point inverter 9200 which performs an inversion of input signal IN at a predefined high threshold, i.e. a high trip point. With transistors MNH1 and MNH2 forming a weak transistor and with the gate of transistor MNH3 tied to its source thereby acting as a resistor in the path to ground GND, the threshold of inverter 9200 is skewed high. Fine tuning of the high threshold is possible by adjusting the transistor size of transistors MPH1, MNH1, and MNH2 and/or cascading additional transistors.

PMOS transistors MPP1, MPP2 and NMOS transistors MNP1, MNP2 form tri-state inverter 9300 which performs an inversion of the outputs MIDL, MIDH of low and high trip point inverters 9100, 9200 only if they produce the same logic value. Otherwise, a high impedance state will exist in tri-state inverter 9300. In particular, tri-state inverter 9300 maintains a barrier to current flow upon dissimilar logic values and provides a direct path to either power source PWR or ground GND upon similar logic values. So, upon nodes MIDL and MIDH having dissimilar values (i.e. node MIDL is low and node MIDH is high or node MIDL is high and node MIDH is low) a high impedance state will exist. Whereas, upon nodes MIDL and MIDH both at a high value, a low impedance path to power source PWR will exist. Likewise, upon nodes MIDL and MIDH both at a low value, a low impedance path to ground GND will exist. Thus, depending on the values of the inputs and their relation to each other—either similar or dissimilar—one of three conditions may exist: a barrier to current flow (a high impedance state), a low impedance path to power source PWR (a high value state), or a low impedance path to ground GND (a low value state).

Tri-state inverter 9300 of FIG. 7c demonstrates an additional improvement possible according to the circuit design of the present invention. Unlike circuit 8000 of the alternative exemplary embodiment depicted in FIG. 7b, tri-state inverter 9300 of circuit 9000 permits a different topological connection to low and high trip point inverters 9100, 9200. Specifically, node MIDL drives complementary-paired transistors MPP1 and MNP1 of tri-state inverter 9300 while node MIDH drives complementary-paired transistors MPP2 and MNP2 of tri-state inverter 9300. Such configuration may result in a reduce propagation delay while maintaining a functionally equivalent operation.

PMOS transistor MPI1 and NMOS transistor MNI1 form weak intermediate inverter 8400 which retains a previous value when not driven by tri-state inverter 8400. Furthermore, PMOS transistors MPI2, MPI3 and NMOS transistors MNI2, MNI3 from 2-stage CMOS buffer 8500 for sharp output transition on output OUT. A detailed explanation of the operation of the exemplary embodiment circuit 9000 is described below.

With input IN at a low potential (e.g. 0 v or GND) transistor MNL1 will be off and transistors MPL2 and MPL3 will be on pulling node MIDL to a high value (e.g. 1.5 v or PWR). Additionally, transistors MNH1 and MNH2 will be off and transistor MPH1 will be on pulling node MIDH to a high value. With both nodes MIDL and MIDH high, transistors MPP1 and MPP2 will be off and transistors MNP1 and MNP2 will be on pulling node MIDA to a low value which is transferred to output OUT via 2-stage buffer 9500.

As input IN increases in potential, low trip point inverter 9100 pulls node MIDL to a low value causing transistor MPP1 to turn on and transistor MNP1 to turn off. Node MIDA remains unaffected though because node MIDH is still at a high value keeping transistors MPP2 off and MNP2 on. Thus, node MIDA is kept at a low value by weak intermediate inverter 9400.

As input IN nears a high potential, high trip point inverter 9200 pulls node MIDH to a low value. With nodes MIDH and MIDL both at a low value, transistors MNP1 and MNP2 will be off and transistors MPP1 and MPP2 will be on pulling node MIDA to a high potential which is transferred to output OUT via 2-stage output buffer 9500.

As input IN then decreases from a high potential, high trip point inverter 9200 pulls node MIDH to a high value causing transistor MPP2 to turn off and transistor MNP2 to on. However, with node MIDL still at a low value, node MIDA remains unaffected being kept high by weak intermediate inverter 9400.

As input IN nears a low potential, low trip point inverter 9100 pulls node MIDL to a high value. With nodes MIDH and MIDL both at a high potential, transistors MPP1 and MPP2 will be off and transistors MNP1 and MNP2 will be on pulling MIDA to a low value which is transferred to output OUT via 2-stage output buffer 9500.

Thus, overall, node MIDA only changes its value when both nodes MIDL and MIDH have the same value—either high or low. If nodes MIDL and MIDH have a different value, both the current path to power source PWR and to ground GND are disconnected leaving node MIDA to be driven by weak intermediate buffer 9400. Such disconnection, in combination with the absence of a bias circuit and the use of CMOS technology and selected topological changes may significantly reduce overall power consumption.

Figure 8A:
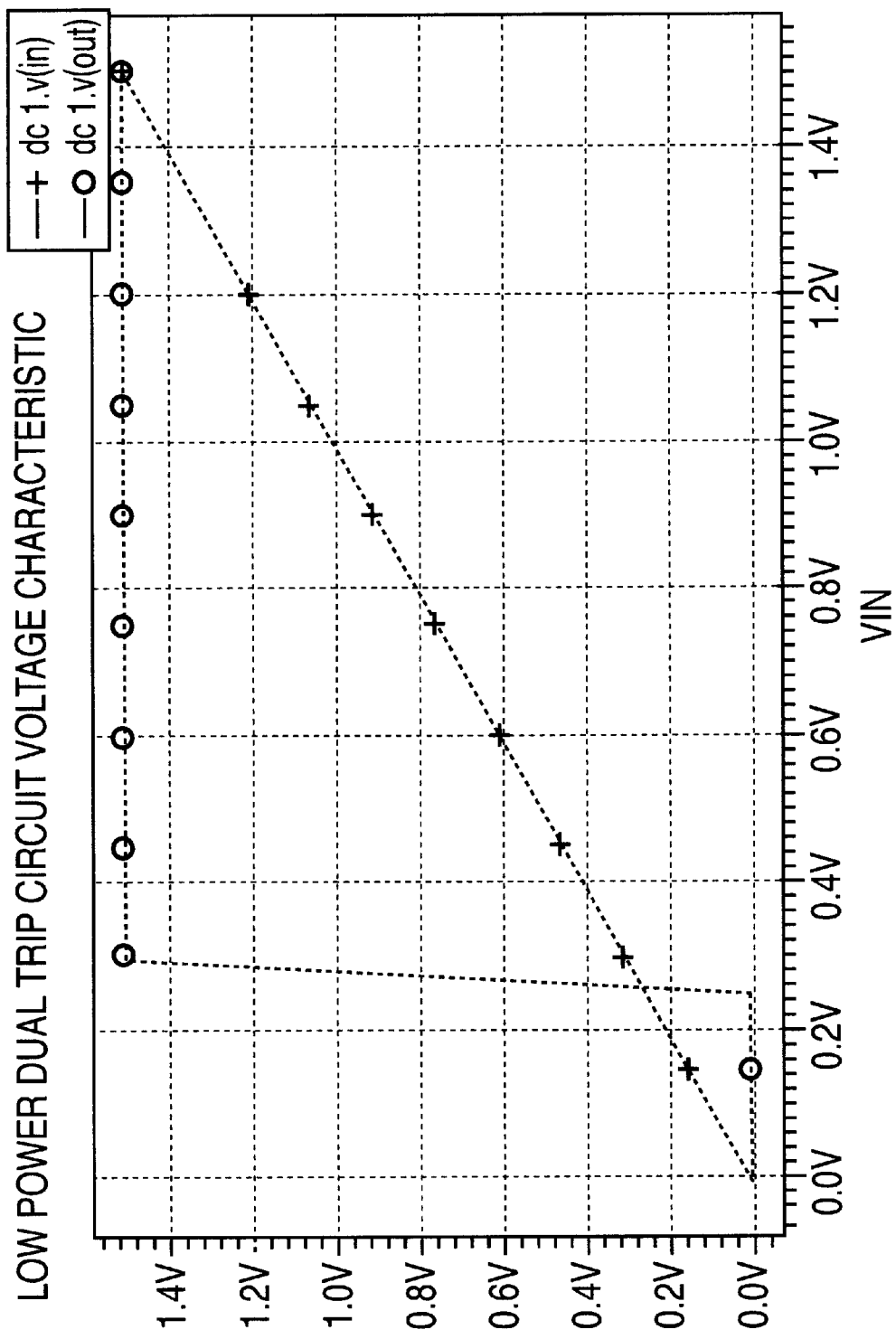
FIG. 8a shows the voltage characteristic of the exemplary embodiment of FIG. 7c during a high to low transition.
Figure 8B:
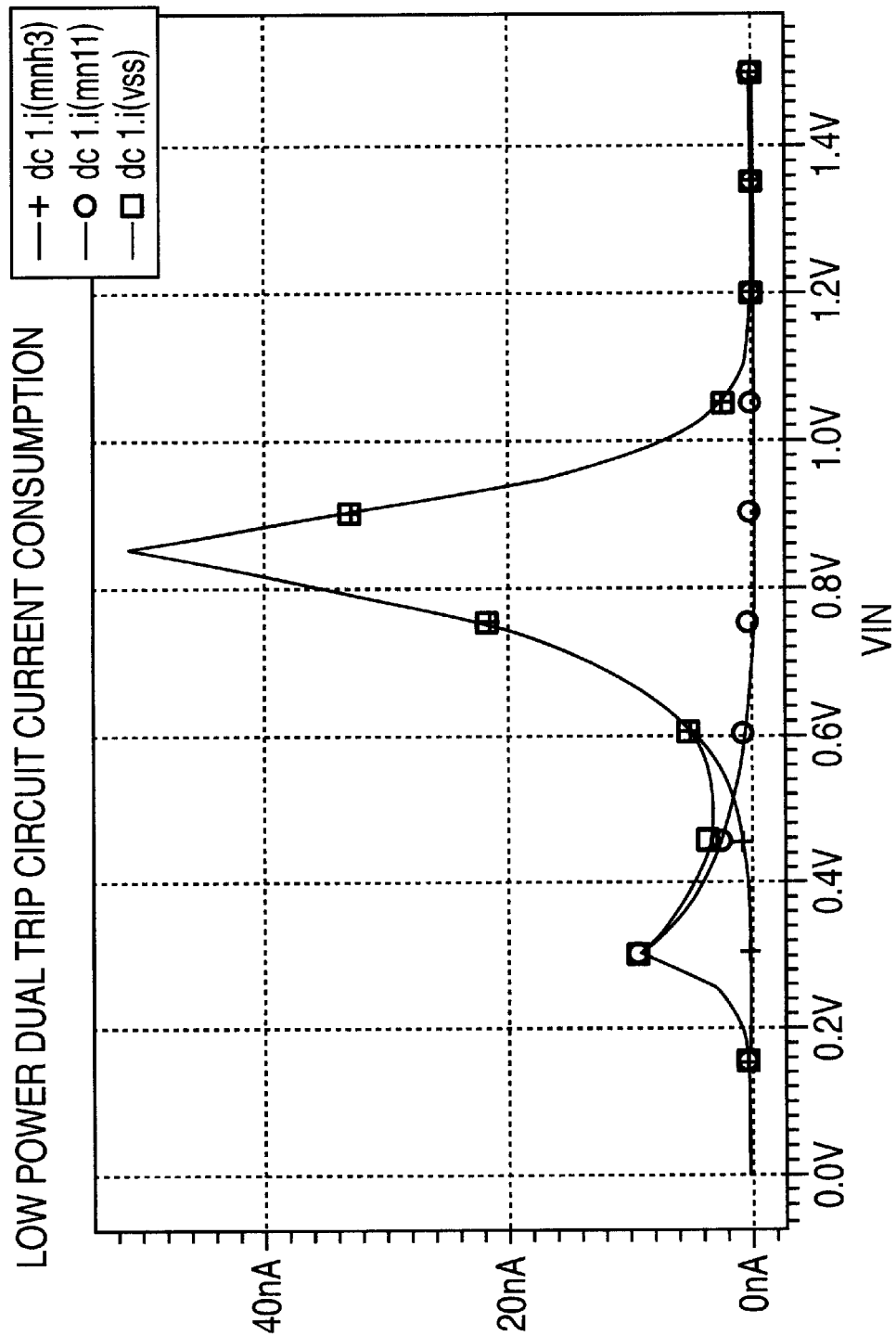
FIG. 8b shows the current consumption of the exemplary embodiment of FIG. 7c during a high to low transition.

FIG. 8a shows the voltage characteristic of low power dual trip point circuit 9000 shows during a high to low transition. FIG. 8b shows the current consumption of circuit 9000 during the same period.

As shown in FIG. 8a, input voltage v(in) decreases linearly while output voltage v(out) remains at a high potential (~1.5 v) until input voltage v(in) reaches a particular threshold level (~0.3 v) whereupon output voltage v(out) drops suddenly and sharply (~0.0 v). Corresponding to the transition from a high to low voltage level, current i(mnh3) flows through transistor MNH3 and current i(mnl1) flows through transistor MNL1 as depicted in FIG. 8b. Such high to low switching currents are significantly reduced as compared with those experienced utilizing Schmidt Trigger circuit 1000. Furthermore, as the overall current consumption i(vss) indicates in FIG. 8*b*, there is essentially no current consumption during non-transition periods.

Figure 9A:
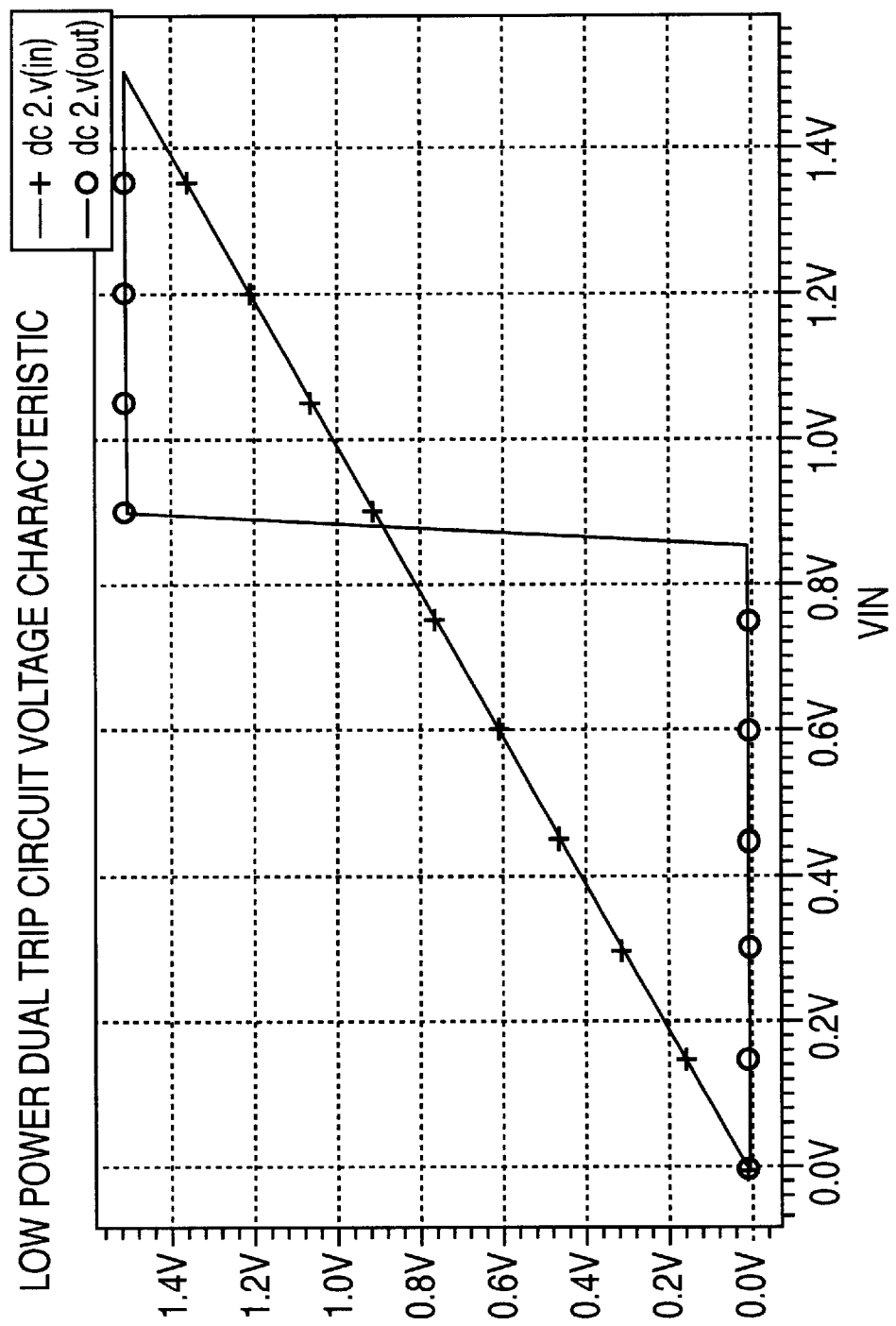
FIG. 9a shows the voltage characteristic of the exemplary embodiment of FIG. 7c during a low to high transition.
Figure 9B:
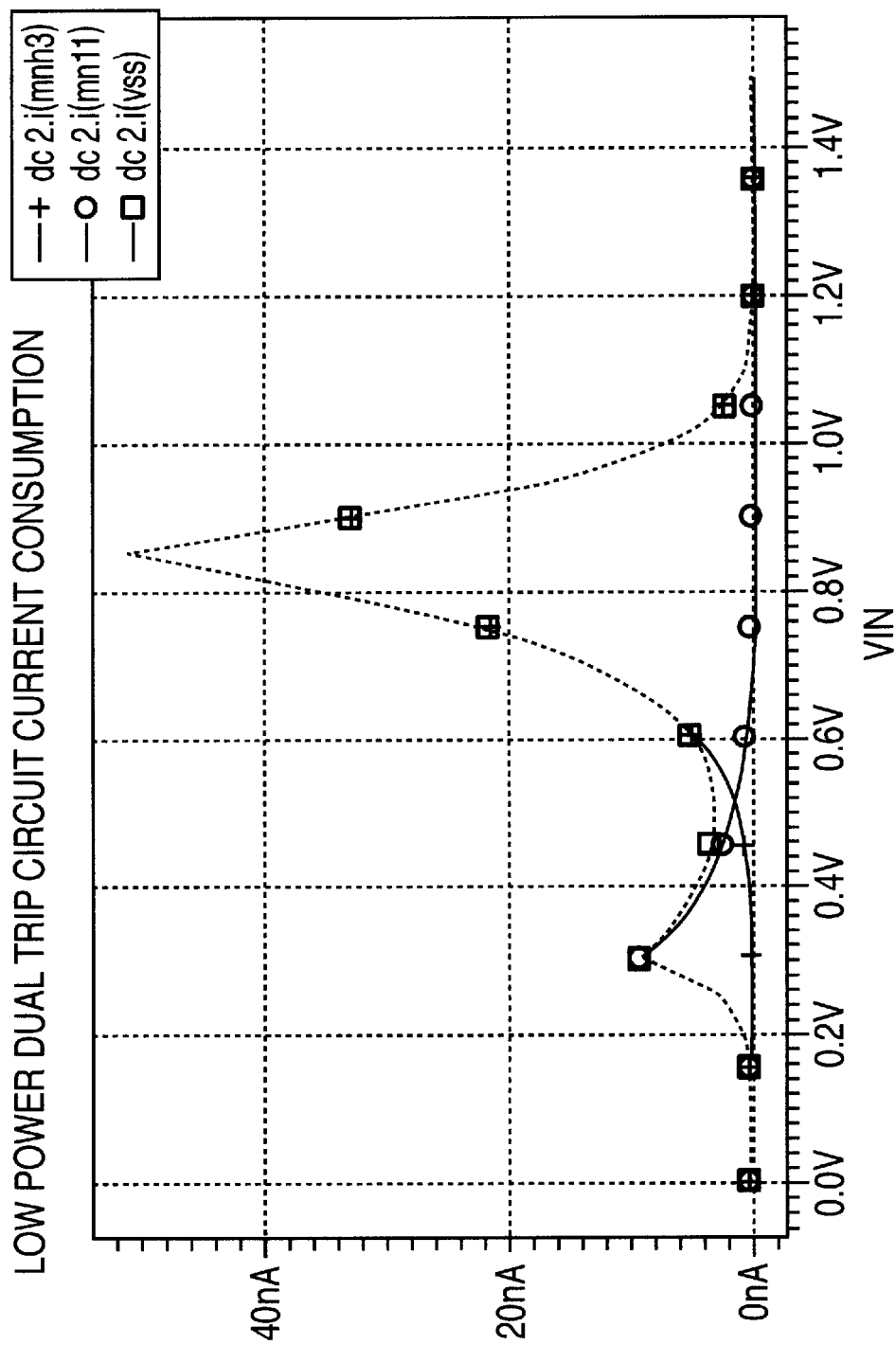
FIG. 9b shows the current consumption of the exemplary embodiment of FIG. 7a during a low to high transition.

FIG. 9*a* shows the voltage characteristic of low power dual trip point circuit 9000 shows during a low to high transition. FIG. 9*b* shows the current consumption of circuit 9000 during the same period.

FIG. 9*a* shows input voltage v(in) increasing linearly while output voltage v(out) remains at a low potential (~0.0 v) until input voltage reaches a particular threshold level (~0.9 v) whereupon output voltage rises suddenly and sharply (~0.0 v). Corresponding to the transition from a low to high voltage level, current i(mnl1) flows through transistor MNL1 and current i(mnh3) flows through transistor MNH3 as depicted in FIG. 9*b*. Such low to high switching currents are significantly reduced as compared with those experienced utilizing Schmidt Trigger circuit 1000. Furthermore, as the overall current consumption i(vss) indicates in FIG. 9*b*, there is essentially no current consumption during non-transition periods.

What is claimed is:

1. An input buffer comprising:
   a first inverter, wherein the first inverter is associated with a first switching threshold value;
   a second inverter, wherein the second inverter is associated with a second switching threshold value, the second switching threshold value different from the first switching threshold value;
   a tri-state inverter;
   a third inverter,
   wherein the first inverter, the second inverter, the third inverter and the tri-state inverter are implemented utilizing CMOS ("Complimentary Metal Oxide Semiconductor") technology,
   wherein the first inverter and the second inverter receive an input signal, an output of the first inverter is coupled to a first input of the tri-state inverter, an output of the second inverter is coupled to a second input of the tri-state inverter and an output of the tri-state inverter is coupled to an input of the third inverter, the third inverter generating an output of the input buffer.

2. The input buffer according to claim 1, wherein the first inverter includes a P-MOS network and an N-MOS network, the input signal being coupled to an input of the P-MOS network and an input of the N-MOS network.

3. The input buffer according to claim 1, wherein the first inverter includes at least one transistor modifying the first switching threshold value and the second inverter includes at least one transistor modifying the second switching threshold value.

4. The input buffer according to claim 1, wherein at least one of the first inverter and the second inverter include a plurality of cascaded transistors.

5. The input buffer according to claim 1, further comprising:
   an output buffer coupled to an output of the third inverter.

6. The input buffer according to claim 5, wherein the output buffer is a multi-stage output buffer.

7. The input buffer according to claim 6, wherein the output buffer is a 2-stage output buffer.

8. A method for reducing a static power consumption of an input-buffer circuit, the input buffer circuit including at least two switching threshold inverters and a tri-state inverter, which is implemented utilizing a load network and a logic network, the logic network receiving an input signal, comprising:
   generating a new circuit such that the load network and the logic network are both driven by the input signal.

9. The method according to claim 8, wherein the tri-state inverter maintains a barrier to a current flow when the at least two switching threshold inverters produce unequal logic values.

10. The method according to claim 8, wherein the tri-state inverter provides a low impedance path when the at least two switching threshold inverters produce equal logic values.

11. A method for reducing a static power consumption of an input-buffer circuit, the input buffer circuit including at least one inverter, which is implemented utilizing a load network and a logic network, the logic network receiving an input signal, comprising:
   generating a new circuit such that the load network and the logic network are both driven by the input signal, wherein the input buffer circuit is implemented with one of pseudo N-MOS and pseudo P-MOS, the load networking being controlled by a biasing circuit for setting a resistive value, and wherein the new circuit operates in a CMOS configuration.

12. A Schmidt Trigger circuit, comprising:
   a high trip point inverter associated with a high switching threshold value;
   a low trip point inverter associated with a low switching threshold value less than the high switching threshold value;
   a tri-state inverter; and
   an intermediate inverter,
   wherein the high trip point inverter, the low trip point inverter, the tri-state inverter and the intermediate inverter are implemented utilizing CMOS ("Complementary Metal Oxide Semiconductor") technology,
   wherein the high trip point inverter and the low trip point inverter receive an input signal, an output of the high trip point inverter is coupled to a first input of the tri-state inverter, an output of the low trip point inverter is coupled to a second input of the tri-state inverter and an output of the tri-state inverter is coupled to an input of the intermediate inverter, the intermediate inverter generating an output of the circuit.

13. The Schmidt Trigger circuit according to claim 12, further comprising:
   an output buffer coupled to the output of the circuit.

14. The Schmidt Trigger circuit according to claim 13, wherein the output buffer is a multi-stage output buffer.

15. The Schmidt Trigger circuit according to claim 14, wherein the output buffer is a 2-stage output buffer.

16. The Schmidt Trigger circuit according to claim 12, wherein the high trip point inverter includes at least one transistor modifying the high switching threshold value and the low trip point inverter includes at least one transistor modifying the low switching threshold value.

17. The Schmidt Trigger circuit according to claim 16, wherein the at least one transistor modifying the high switching threshold value includes a direct connection to a common power source and the at least one transistor modifying the low switching threshold value includes a direct connection to a common ground.

18. The Schmidt Trigger circuit according to claim 17, wherein at least one of the high trip point inverter and the low trip point inverter include a plurality of cascaded transistors.

19. The Schmidt Trigger circuit according to claim 12, wherein:

the tri-state inverter maintains a barrier to a current flow when a logic value produced by the high trip point inverter does not equal a logic value produced by the low trip point inverter;

the tri-state inverter provides a low impedance path to a common power source when the high trip point inverter and the low trip point inverter produce a high logic value;

the tri-state inverter provides a low impedance path to a common ground when the high trip point inverter and the low trip point inverter produces a low logic value.

20. A method for processing an input signal, comprising:

receiving an input signal;

generating a first inverted value of the input signal upon a first threshold, wherein the first inverted value is generated by driving a logic network and a load network with the input signal;

generating a second inverted value of the input signal upon a second threshold being less than the first threshold, wherein the second inverted value is generated by driving a second logic network and a second load network with the input signal;

generating an intermediate signal as a function of the first and second inverted value by:
  if the first inverted value equals the second inverted value, the intermediate signal is set to a complement of the first inverted value;
  if the first inverted value does not equal the second value, the intermediate signal is maintained to a value generated on a prior clock cycle.

21. The method according to claim 20 further comprising:

buffering the intermediate signal to sharpen an output transition.

* * * * *